United States Patent

Ruthenberg et al.

[15] 3,646,397

[45] Feb. 29, 1972

[54] AMPLIFIER PROTECTION CIRCUIT RESPONSIVE TO TEMPERATURE AND OVERCURRENT

[72] Inventors: Ross E. Ruthenberg; Joseph W. Spells, Jr., both of Des Plaines, Ill.

[73] Assignee: Motorola, Inc., Franklin Park, Ill.

[22] Filed: Apr. 13, 1970

[21] Appl. No.: 27,669

[52] U.S. Cl. ....................317/16, 317/20, 317/33 R, 317/41, 307/202, 330/207 P

[51] Int. Cl. ....................H02h 7/20, H02h 5/04

[58] Field of Search ....................317/16, 20, 33, 41; 307/202, 307/98, 99; 330/207 P, 127, 123, 143, 179, 180; 328/259; 335/153

[56] References Cited

UNITED STATES PATENTS

| | | | |
|---|---|---|---|
| 3,303,391 | 2/1967 | Kitami | 317/41 |
| 3,497,840 | 2/1970 | Stauder | 335/153 |
| 3,281,697 | 10/1966 | Hansen | 307/202 X |
| 3,323,017 | 5/1967 | Powell | 317/20 |
| 3,496,415 | 2/1970 | Ruthenberg | 317/16 |

*Primary Examiner*—D. F. Duggan
*Assistant Examiner*—Harvey Fendelman
*Attorney*—Mueller and Aichele

[57] ABSTRACT

A protection circuit for the transistorized power amplifier of a transmitter is provided in the form of a normally shunted reactive circuit coupled in series with the input to the power amplifier stage means of a current stepdown transformer. When excessive current is drawn by the power amplifier or when an excessive temperature is reached the shunting circuit is opened thereby connecting the reactive component in series between the driver stage and the power amplifier stage to partially detune the driver output, reducing the drive to the power amplifier stage.

10 Claims, 1 Drawing Figure

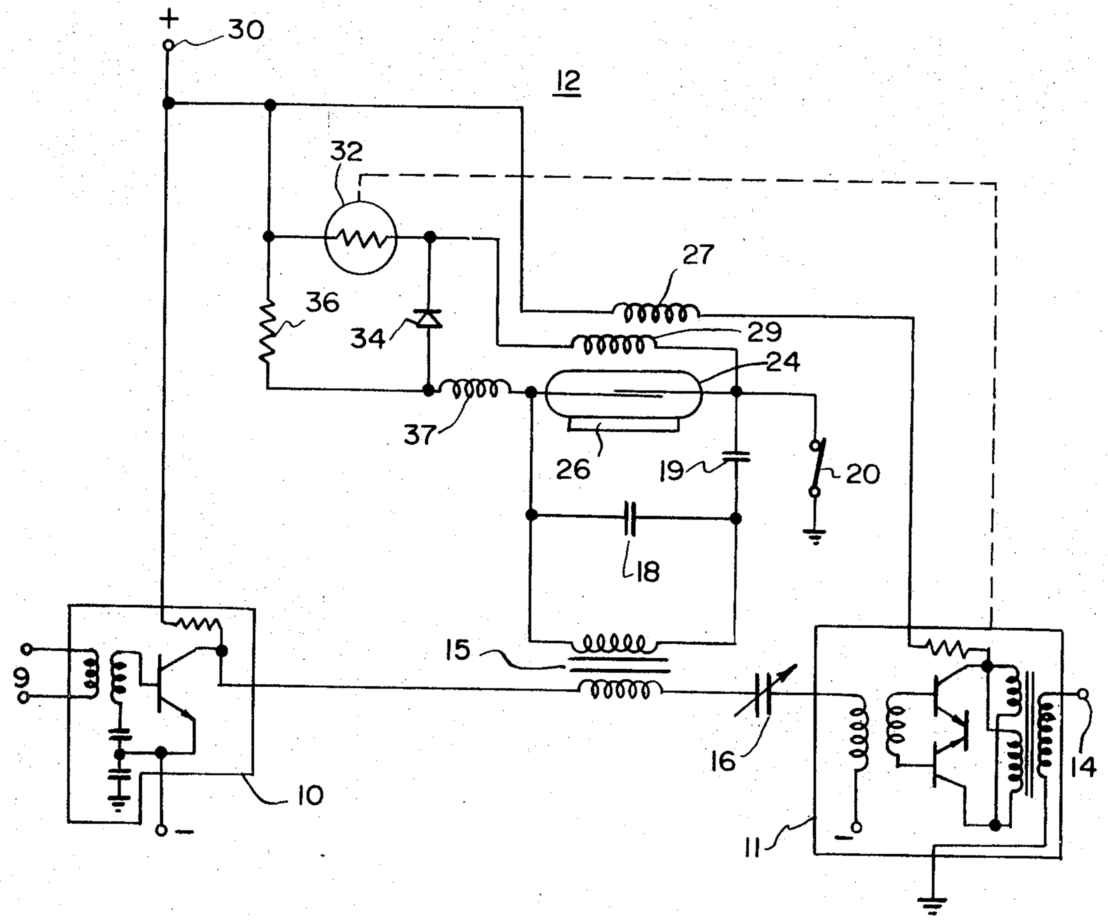
INVENTORS
ROSS E. RUTHENBERG
JOSEPH W. SPELLS, JR
BY Mueller, Aichele & Rauner
ATTORNEYS.

AMPLIFIER PROTECTION CIRCUIT RESPONSIVE TO TEMPERATURE AND OVERCURRENT

BACKGROUND OF THE INVENTION

The development of transistors and other semiconductor components has made possible a reduction in the size and power consumption of electronic devices. In transistorized radio transmitters it is often necessary to operate the output stages at or near the maximum ratings of the transistors used in order to obtain optimum gain and power output. In the event that power amplifier load mismatch occurs due to a fault or due to antenna mismatch, such as is caused by passing under a bridge or operating near a large ground plane, the transistors in the power amplifier output stages may draw excess current. Similarly, excess current may be drawn upon the occurrence of output detuning. Since the transistors in the power amplifier stages already are being operated near maximum ratings, the excess current flowing through the transistors, if permitted to continue, could cause breakdown and burning out of the transistors.

The transistors of the transmitter output amplifier also may need to be protected against overheating caused in any manner, such as by increases in the power supply voltage and the like since overheating may result in destruction of the transistor. Such overheating can be protected against by reducing the drive to the power amplifier transistors.

Systems have been provided for protecting the power amplifier transistor stages of such transmitters by sensing the overheating or excessive current drawn by the amplifier stage in a feedback loop to control the operation of the driver stages of the transmitter. Other protective circuits sense the condition which could cause damage to the power amplifier transistors and cause a complete shutdown of the transmitter, necessitating a manual resetting before operation can resume.

SUMMARY OF THE INVENTION

Accordingly, it is an object of this invention to provide an improved protection circuit for an amplifier system.

It is an additional object of this invention to protect an output amplifier stage of an amplifier system by coupling an impedance in the series path between the driver stage and the output stage of the amplifier system to be protected.

It is a further object of this invention to insert a reactive impedance in series between the output of a driving amplifier stage and a final amplifier stage whenever an overload condition of operation of the final amplifier stage occurs to partially detune the driving stage output as applied to the input of the final amplifier stage.

In accordance with a preferred embodiment of this invention, a protection circuit for an amplifier system having a driving stage producing a driving signal and a driven stage, responsive to the driving signal and protected by reducing the drive thereto in response to a predetermined condition, includes an impedance coupled in series between the output of the driving stage and the input of the driven stage. This impedance normally is rendered ineffective by a shunt coupled across it; but when the predetermined condition is sensed, the shunt is disabled or opened, thereby rendering the impedance effective to reduce the level of driving signals applied to the driven amplifier stage.

In a more specific form, the impedance is a reactive impedance which is transformer coupled in the series path between the two amplifier stages, with the shunt being in the form of normally closed reed relay contacts. The reed relay is provided with an operating coil, the current through which is indicative of the condition of operation of the driven amplifier stage; and when this current exceeds a predetermined level above which damage to the driven amplifier stage could occur, the field produced by the coil is sufficient to open the contacts. This inserts the reactive impedance in series with the output of the driver stage by transformer action, reducing the drive to the driven stage to protect it against the overload condition.

BRIEF DESCRIPTION OF THE DRAWING

The sole FIGURE of the drawing is a schematic diagram, partially in block form, of a protection circuit according to a preferred embodiment of the invention.

DETAILED DESCRIPTION

Referring now to the drawing, there is shown a portion of a transmitter including a driver amplifier stage 10, the output of which is connected to the input of a driven, final, transistorized, power amplifier stage 11 of a radio transmitter, with a protection circuit 12 operating to protect the transistorized power amplifier 11 against overload and overheating. The stages 10 and 11 are not completely shown since these stages may be conventional stages of a radio transmitter. The input signals to the driving amplifier stage 10 are applied to a pair of terminals 9 from frequency triplers or the like of a conventional transmitter, and the output of the power amplifier stage 11 is applied to an output terminal 14 which may be coupled to the antenna of the transmitter in a conventional manner. The details of the radio transmitter have not been shown, since they are unimportant to the operation of the protection circuit 12 and may be of a number of conventional configurations.

The protection circuit 12 includes a current stepdown transformer 15, the primary winding of which is connected in series with a variable capacitor 16 between the output of the driver amplifier stage 10 and the input to the power amplifier stage 11. The secondary winding of the current stepdown transformer 15 has a high reactive capacitor 18 connected across it, with one end of the secondary winding also connected through an RF bypass capacitor 19 and a normally closed reset switch 20 to ground. The junction of the capacitor 18 and switch 20 further is connected to one of the contacts of a reed relay switch 24, the other contact of which is connected to the other end of secondary winding of the transformer 15.

To prevent the high reactive impedance formed by the capacitor 18 from having an affect on the operation of the circuit under normal conditions of operation, the contacts of the reed relay switch 24 are normally biased closed by a permanent magnetic field provided by a permanent magnet 26 mounted adjacent to the reed switch 24. As a consequence, the closed contacts of the reed switch 24 shunt the ends of the secondary winding of the transformer 15; so that the circuit operates as if the transformer 15 were not in the circuit and there is minimal power dissipation in the protection circuit 12 for the normal operating conditions of the transmitter.

The power amplifier stage 11 however, is protected against overload conditions by the provision of two operating coils 27 and 29, located to produce adding fields in the reed switch 24 which oppose the field developed by the permanent magnet 26. The operating coil 27 is coupled to the source of positive operating potential applied to a terminal 30 and is in series with the current supply for the power amplifier stage 11. Under normal conditions of operation, the current flowing through the operating coil 27, which is the current drawn by the transistorized power amplifier stage 11, is insufficient to cause the field produced by the winding 27 to overcome the opposing bias field produced by the permanent magnet 26. Thus the operating coil 27 has no affect on the operation of the circuit under normal conditions.

The operating coil 29 has one end coupled to ground through the reset switch 20 and the other end coupled through a thermistor 32 to the positive supply terminal 30. The thermistor 32 exhibits a negative temperature coefficient and is physically located to be subjected to the temperature of the power amplifier heat sink. This normally can be accomplished by attaching the thermistor 32 directly to the power amplifier heat sink and this physical connection has been indicated by the dotted line in the drawing. For normal conditions of operation, with the operating temperature of the power amplifier 11 being in a relatively low range, the thermistor 32 exhibits a high impedance, and the current flowing through the thermistor 32 and coil 29 is insufficient to produce a field great enough to overcome the biasing field of the magnet 26. This current is prevented from flowing through the closed contacts of the reed switch 24 by a blocking diode 34 when the contacts of the reed switch 24 are closed; so that the current flowing through the thermistor 32 must flow through the coil 29. Current during normal conditions of operation also flows through the closed contacts of the reed switch 24 through a current-limiting resistor 36 and an RF blocking choke 37.

It is apparent that there is some power consumption in the current limiting resistor 36 and in the thermistor 32 during the normal operating condition of the protection circuit 12, but this power consumption is relatively low and is not derived from the signals applied from the driver stage 10 to the power amplifier stage 11 or from the output signals produced by the power amplifier stage 11.

If for any reason the power amplifier stage 11 commences to draw a current which is in excess of the safe level of current which may be drawn by the transistors in the power amplifier, or if overheating of the power amplifier 11 reaches a point where damage from overheating could result, sufficient current flows through either or both of the windings 27 and 29 to produce a field great enough to counteract the field of the permanent magnet 26, opening the contacts of the reed switch 24. It is apparent that whenever a combination of a high final current through the power amplifier 11 and temperature sensitive current through the thermistor 32 produces a composite field in the coils 27 and 29 in excess of that produced by the magnet 26, the contacts of the reed relay switch 24 will be opened. This operation can be effected by either of the coils 27 or 29 or both of them operating in conjunction.

Whenever the contacts of the reed switch 24 are opened, the shunting action of reed switch 24 is removed and the reactive impedance (capacitor 18) is coupled across the secondary winding of the stepdown transformer 15. The primary winding of the transformer 15 then is loaded with this reactive impedance and detunes the output of the driver stage 10, which reduces the signal power supplied to the power amplifier stage 11. As a consequence, the transmitted power output drops, and the final current through the power amplifier stage 11 also falls. This results in a protection of the final amplifier stage 11 without disrupting its operation.

To prevent intermittent opening and closing of the contacts of the reed switch 24, the contacts are held open by a current path established through the current-limiting resistor 36, the diode 34 and the operating coil 29 to ground through the reset switch 20. This current path is established immediately upon opening of the reed switch contacts 24, which causes the diode 34 to be forward biased, and provides sufficient current through the operating coil 29 to maintain the contacts of the reed switch 24 open irrespective of any subsequent reductions in current through the operating coil 27 and through the thermistor 32. When it is desired to reset the circuit, the reset switch 20 momentarily is opened, which then breaks the current path through the operating coil 29, permitting the permanent magnet 26 once again to close the contents of the reed switch 24. Upon reclosure of the reset switch 20, the circuit is returned to its original state of operation.

It should be noted that by employing the transformer 15 and the protection circuit which is shown in the drawing, a reed switch 24 which is not capable of handling the high power present in the path coupling the driver stage 10 to the input of the power stage 11 may be utilized. This permits miniaturization of the components and reduced cost in the manufacture of the protection circuit over that which would be required if the contacts of the switch 24 were used to carry the output of the driver stage 10 applied to the input of the power amplifier stage 11. It further should be apparent that only a single operating coil 27 or 29 could be employed to sense either of the two conditions which are sensed by the protection circuit 12 if the dual condition sensing provided by the circuit shown in the drawing were not desired or were not considered necessary.

We claim:

1. A protection circuit for an amplifier system having a driving stage producing driving signals and a driven stage responsive to the driving signals and subject to damage upon occurrence of a predetermined condition, the protection circuit including in combination:

impedance means coupled in series between the output of the driving stage and the input of the driven stage of the amplifier system;

relay means having normally closed relay contacts and an operating coil;

shunt circuit means coupling the normally closed relay contacts across the impedance means for rendering the impedance means ineffective; and means coupled with the operating coil and responsive to the presence of said predetermined condition for causing sufficient current to flow through the operating coil to open the contacts, thereby rendering the impedance means effective to reduce the level of the driving signals applied to the driven stage.

2. A protection circuit for an amplifier system having a driving stage producing driving signals and a driven stage responsive to the driving signals and subject to damage upon occurrence upon a predetermined condition, the protection circuit including in combination:

impedance means including a transformer, the primary winding of which is coupled in series between the output of the driving stage and the input of the driven stage, and a reactive impedance means coupled with a secondary winding of the transformer;

shunt means coupled across the reactive impedance means for rendering the reactive impedance means ineffective; and means responsive to the presence of said predetermined condition for disabling the shunt means, thereby rendering the reactive impedance means effective to reduce the level of the driving signals applied to the driven stage.

3. The combination according to claim 1 including further circuit means responsive to the opening of the relay contacts and coupled to a source of operating potential for maintaining the operating coil current at a level sufficient to maintain the contacts open irrespective of further changes in said predetermined condition.

4. The combination according to claim 2 wherein the reactive impedance means is capacitance means coupled across the secondary winding, the shunt means comprises normally closed relay contacts coupled across the secondary winding, and the means for disabling the shunt means includes an operating coil for the relay contacts to open the same in response to a predetermined current flowing through the coil, and further including means responsive to the presence of said predetermined condition for causing said predetermined current to flow through the operating coil.

5. The combination according to claim 4 wherein the relay contacts are contacts of a reed relay further having a permanent magnet for biasing the contacts of the relay to a closed position, with said predetermined current through the operating coil of the relay overcoming the bias of the permanent magnet to open the contacts.

6. The combination according to claim 4 wherein the operating coil is coupled in series with the current supply to the driven amplifier stage and wherein the predetermined condition constitutes a predetermined current drawn by the driven amplifier stage, said predetermined current being sufficient to cause the operating coil to open the relay contacts.

7. The combination according to claim 6 further including a second operating coil and a temperature-sensitive resistance means with a negative temperature coefficient coupled in series with one another between a source of potential and a point of reference potential, with said second coil further being coupled with the relay contacts for opening said relay contacts in response to a second predetermined current through the second coil, said second predetermined current flowing when the temperature-sensitive resistance means is subjected to a predetermined temperature, and the temperature-sensitive resistance means being located for sensing the temperature of the driven amplifier stage.

8. The combination according to claim 4 wherein the predetermined condition is a predetermined temperature and the means for causing said predetermined current to flow comprises temperature-sensitive resistance means with a negative temperature coefficient coupled in series with the operating coil between a source of potential and a point of reference potential, so that said predetermined current flows through the operating coil when the temperature of the temperature-sensitive resistance means reaches said predetermined temperature.

9. The combination according to claim 8 wherein the temperature sensitive resistance means and the operating coil are connected at a first junction, and further including third impedance means connected at a second junction with the relay contacts in series between said source of potential and said point of reference potential, and unidirectional conductive means coupled between the first and second junctions, the unidirectional conductive means being reverse biased when the relay contacts are closed, with opening of the relay contacts forming a holding current path from the source of potential through the third impedance means, the unidirectional conductive means and the operating coil to said point of reference potential to maintain the operating coil current at a level sufficient to maintain the contacts open irrespective of the impedance of the temperature-sensitive resistance means.

10. The combination according to claim 9 including normally closed reset switch means for opening the current path through the operating coil upon actuation thereof to disable the holding path.

* * * * *